US012615751B2

(12) United States Patent
Nakai et al.

(10) Patent No.: US 12,615,751 B2
(45) Date of Patent: Apr. 28, 2026

(54) DEVICE MANAGEMENT APPARATUS, SUBSTRATE WORK MACHINE, AND DEVICE MANAGEMENT METHOD

(71) Applicant: FUJI CORPORATION, Chiryu (JP)

(72) Inventors: Kenji Nakai, Anjo (JP); Nobuhisa Komiyama, Okazaki (JP); Akira Hara, Toyohashi (JP); Yuichi Shimamoto, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 481 days.

(21) Appl. No.: 18/040,156

(22) PCT Filed: Sep. 14, 2020

(86) PCT No.: PCT/JP2020/034697

§ 371 (c)(1),
(2) Date: Feb. 1, 2023

(87) PCT Pub. No.: WO2022/054275

PCT Pub. Date: Mar. 17, 2022

(65) Prior Publication Data

US 2023/0320054 A1     Oct. 5, 2023

(51) Int. Cl.
*H05K 13/08*     (2006.01)
*G05B 19/402*     (2006.01)

(52) U.S. Cl.
CPC ....... *H05K 13/0882* (2018.08); *G05B 19/402* (2013.01); *H05K 13/086* (2018.08); *G05B 2219/36262* (2013.01)

(58) Field of Classification Search
CPC ........ G05B 19/402; G05B 2219/36262; H05K 13/085; H05K 13/086; H05K 13/0882
See application file for complete search history.

(56) References Cited

U.S. PATENT DOCUMENTS 6,027,019 A * 2/2000 Kou ..................... H05K 13/087
                                                        29/709
2003/0219330 A1 * 11/2003 Lyndaker ........... H05K 13/0419
                                                        414/416.1

(Continued)

FOREIGN PATENT DOCUMENTS

JP       11-224999 A      8/1999
JP       2015-18930 A     1/2015
JP       2018-32279 A     3/2018

OTHER PUBLICATIONS

International Search Report mailed on Nov. 17, 2020 in PCT/JP2020/034697 filed on Sep. 14, 2020 (2 pages).

*Primary Examiner* — Kidest Worku
(74) *Attorney, Agent, or Firm* — Oblon, McClelland, Maier & Neustadt, L.L.P.

(57)     ABSTRACT

A device management apparatus includes a board working machine and a management section. The board working machine includes a first slot and a second slot, and performs a predetermined board work on a board to produce a board product. The first slot can hold a device used in the production of the board product. The second slot can preliminarily hold the device that is scheduled to be used in the production of the board product or can temporarily hold the device that has become unnecessary in the production of the board product. The management section updates a control program for controlling the device of a target device requiring update of the control program in the second slot.

13 Claims, 5 Drawing Sheets

(56)             References Cited

U.S. PATENT DOCUMENTS

| | | | |
|---|---|---|---|
| 2018/0084684 A1* | 3/2018 | Ohashi | ............... H05K 13/0417 |
| 2019/0045680 A1* | 2/2019 | Kondo | ................. H05K 13/021 |
| 2019/0230832 A1* | 7/2019 | Ohashi | ............... G06Q 10/0875 |

* cited by examiner

DEVICE MANAGEMENT APPARATUS, SUBSTRATE WORK MACHINE, AND DEVICE MANAGEMENT METHOD

TECHNICAL FIELD

The present specification discloses a technique related to a device management apparatus, a board working machine, and a device management method.

BACKGROUND ART

A mounter described in Patent Literature 1 includes first determination means, first guiding means, and updating means. The first determination means determines whether a grace time until the use of a feeder to be provisioned is started is longer than a provision updating time obtained by totaling two times of a provision time for preparing and provisioning a component and an updating time required for processing for updating a control program of the feeder to be provisioned. The first guide means guides the provision guide to the effect that the control program replenishes a feeder that is not updated when the first determination means determines that the grace time is longer than the provision updating time. The updating means updates the control program of the provisioned feeder.

PATENT LITERATURE

Patent Literature 1: JP-A-2015-18930

BRIEF SUMMARY

Technical Problem

However, in the mounter described in Patent Literature 1, the feeder to be provisioned is connected to a slot used in the production of a board product. Therefore, there is a possibility that the mounter cannot use the feeder or at least a part of functions of the feeder while the update processing of the control program is executed, so that the production efficiency of the board product is reduced.

In view of such a circumstance, the present specification discloses a device management apparatus, a board working machine, and a device management method capable of updating a control program for controlling a device used in the production of a board product while suppressing reduction in the production efficiency of the board product.

Solution to Problem

The present specification discloses a device management apparatus including a board working machine and a management section. The board working machine of performing a predetermined board work on a board to produce a board product includes a first slot and a second slot. The first slot can hold the device used in the production of the board product. The second slot can preliminarily hold the device that is scheduled to be used in the production of the board product or can temporarily hold the device that has become unnecessary in the production of the board product. The management section is configured to update a control program for controlling the device of a target device requiring update of the control program in the second slot.

In addition, the present specification discloses a board working machine including a first slot, a second slot, and a management section, and performing a predetermined board work on a board to produce a board product. The first slot can hold the device used in the production of the board product. The second slot can preliminarily hold the device that is scheduled to be used in the production of the board product or can temporarily hold the device that has become unnecessary in the production of the board product. The management section is configured to update a control program for controlling the device of a target device requiring update of the control program in the second slot.

In addition, the present specification discloses a device management method using a board working machine, the device management method includes a management step. The board working machine of performing a predetermined board work on a board to produce a board product includes a first slot and a second slot. The first slot can hold the device used in the production of the board product. The second slot can preliminarily hold the device that is scheduled to be used in the production of the board product or can temporarily hold the device that has become unnecessary in the production of the board product. The management step updates a control program for controlling the device of a target device requiring update of the control program in the second slot.

Advantageous Effects

According to the device management apparatus described above, the management section is provided. The management section updates the control program of the target device in the second slot. Therefore, the device management apparatus can suppress reduction in the production efficiency of the board product as compared with a case where the control program of the target device is updated in the first slot. The above description can be similarly applied to the board working machine and the device management method.

DESCRIPTION OF EMBODIMENTS

1. Embodiments

1-1. Configuration Example of Board Production Line WL0

Figure 1:
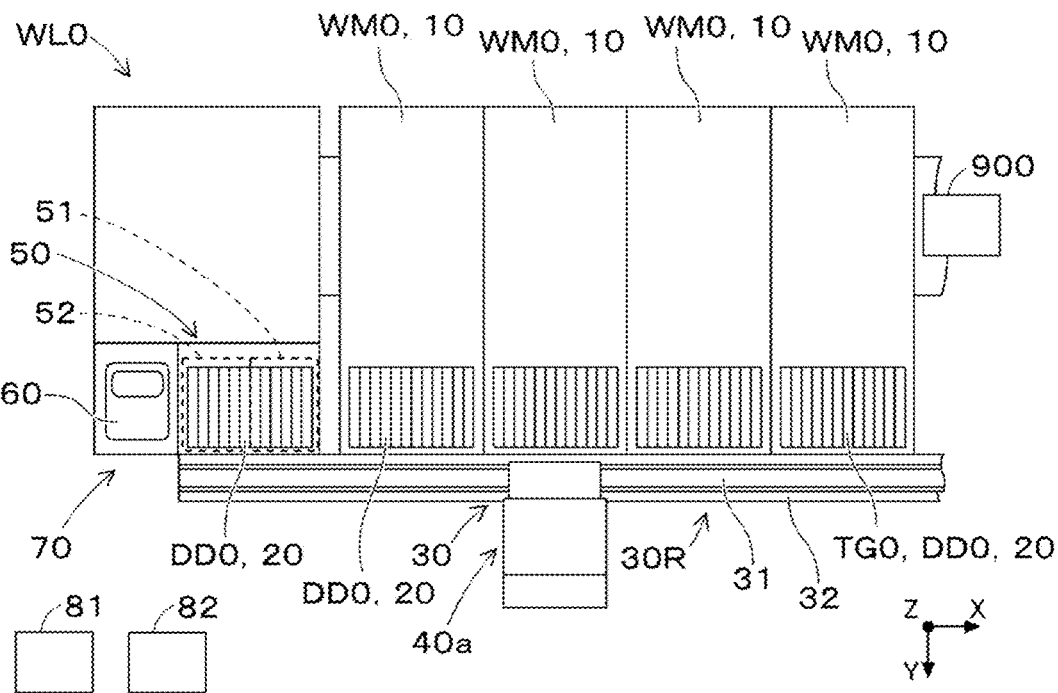
FIG. 1 is a plan view illustrating a configuration example of a board production line.

Device management apparatus 70 of the present embodiment is applied to board production line WL0. As illustrated in FIG. 1, board production line WL0 includes at least one component mounter 10 (four in FIG. 1), exchange system 30, conveyance device 40a, storage device 50, and line management device 60. Four component mounters 10 are installed along a conveyance direction (X-direction) of board 90 illustrated in FIG. 2. Component mounter 10 is included in board working machine WM0 that performs a predetermined board work on board 90. The board work by component mounter 10 includes a carrying-in work and a carrying-out work of board 90, a supply work, a pick-up work, a mounting work, and the like of the component. Component mounter 10 is detachably provided with, for example, cassette-type feeder 20.

Storage device 50 used for storing feeder 20 is installed, for example, on the board loading side of board production line WL0 (on the left of the drawing in FIG. 1). In addition, exchange system 30 and conveyance device 40*a* are provided on board production line WL0, and perform supply work, exchange work, and collecting work of feeder 20. The configuration of board production line WL0 may be appropriately added or changed according to, for example, the type of board product 900 to be produced. Specifically, board working machine WM0 such as a solder printer, a solder inspection machine, a reflow furnace, and an appearance inspector can be appropriately installed in board production line WL0. As described above, board production line WL0 can sequentially convey board 90 using various board working machines WM0, execute production processing including inspection processing, and produce board product 900.

Board working machine WM0 constituting board production line WL0 is configured to be capable of inputting and outputting various data to and from line management device 60 via a network. For example, storage device 50 includes multiple slots. Storage device 50 stocks feeder 20 installed in the multiple slots. Feeder 20 installed in the slot of storage device 50 is in a state capable of communicating with line management device 60. As a result, the slot of storage device 50 and the identification information of feeder 20 installed in the slot are associated with each other and recorded in line management device 60.

In addition, line management device 60 monitors an operation situation of board production line WL0, and integrally controls board working machine WM0 such as component mounter 10, exchange system 30, conveyance device 40*a*, and storage device 50. Line management device 60 stores various data for controlling board working machine WM0, exchange system 30, conveyance device 40*a*, and storage device 50. Line management device 60 transmits various data such as a production program when, for example, component mounter 10 executes the component mounting process.

1-2. Configuration Example of Component Mounter 10

Figure 2:
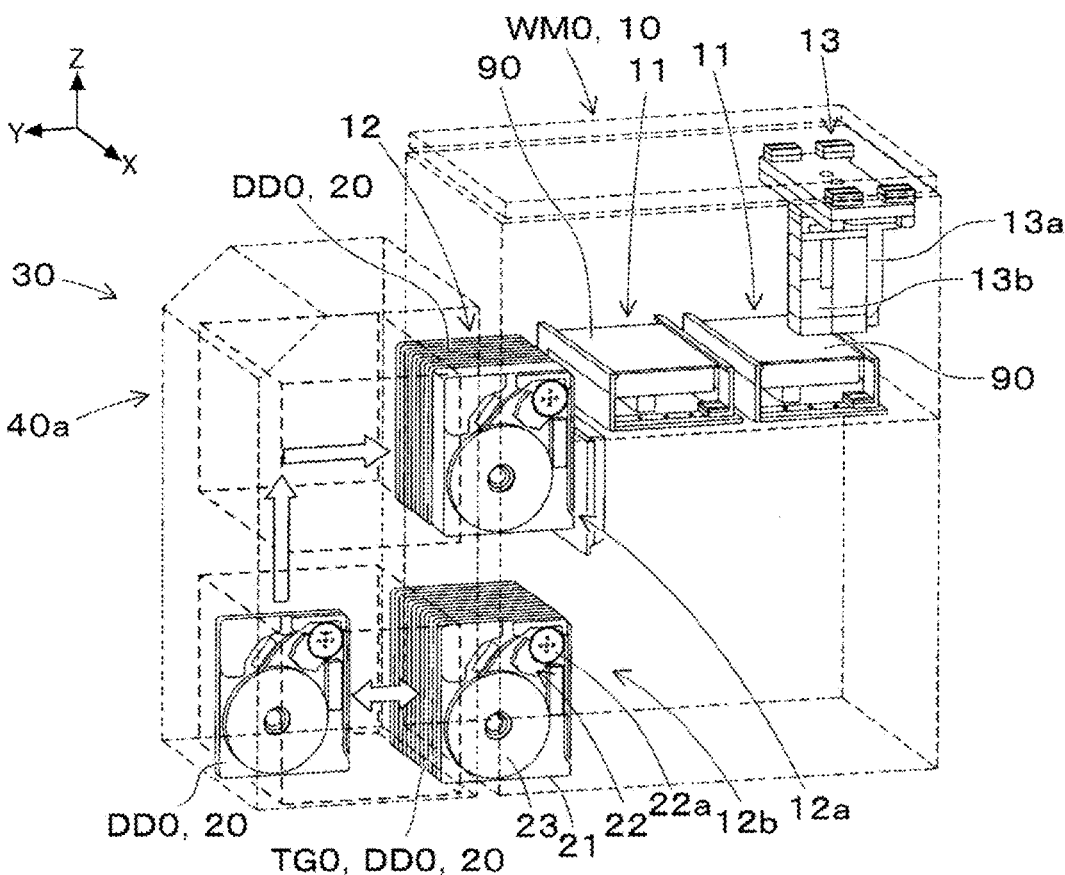
FIG. 2 is a perspective view illustrating a configuration example of an exchange system and a component mounter illustrated in FIG. 1.

As illustrated in FIG. 2, each of four component mounters 10 includes board conveyance device 11, component supply device 12, and head driving device 13. In the present specification, the conveyance direction of board 90 is defined as an X-direction. In addition, a direction orthogonal to the X-direction in the horizontal plane is defined as a Y-direction. In addition, a vertical direction (up-down direction in the drawing in FIG. 2) orthogonal to the X-direction and the Y-direction is defined as a Z-direction.

Board conveyance device 11 is configured by, for example, a belt conveyor and a positioning device. Board conveyance device 11 sequentially conveys board 90 in the conveyance direction (X-direction), and positions board 90 at a predetermined position in the machine. Board conveyance device 11 carries board 90 out of component mounter 10 after a mounting process by component mounter 10 is ended.

Component supply device 12 supplies a component to be mounted on board 90. Component supply device 12 includes first slot 12*a* and second slot 12*b* that can be installed with multiple feeders 20. In the present embodiment, first slot 12*a* is disposed in an upper portion of a front portion side of component mounter 10 to operably hold installed feeder 20. An operation of feeder 20 installed in first slot 12*a* is controlled in the mounting process by component mounter 10, and a component is supplied at a takeout section provided at a defined position at the upper portion of feeder 20. As described above, first slot 12*a* can hold feeder 20 used in the production of board product 900.

In the present embodiment, second slot 12*b* is disposed below first slot 12*a* to stock installed feeder 20. Specifically, second slot 12*b* preliminarily holds feeder 20 that is scheduled to be used in the production of board product 900. In addition, second slot 12*b* temporarily holds feeder 20 that has become unnecessary in the production of board product 900. The exchange work of feeder 20 between first slot 12*a* and second slot 12*b* is performed by conveyance device 40*a*.

As illustrated in FIG. 2, feeder 20 includes feeder main body 21 and driving device 22. Feeder main body 21 of the present embodiment is formed in a flat box shape. The feeder main body 21 detachably (exchangeably) holds reel 23 on which a carrier tape accommodating multiple components is wound. Driving device 22 includes sprocket 22*a* that engages with a feeding hole provided in the carrier tape. Driving device 22 rotates sprocket 22*a* to feed and move the carrier tape.

The operation of driving device 22 of feeder 20 is controlled by the control device of component mounter 10. When being installed in first slot 12*a* of component mounter 10, feeder 20 receives power from component mounter 10 via a connector, and is in a communicable state with component mounter 10. As a result, component mounter 10 can detect the supply and collect of feeder 20 in first slot 12*a*. The same applies to second slot 12*b* as described above for first slot 12*a*.

Feeder 20 installed in first slot 12*a* controls the feeding operation of the carrier tape accommodating the component based on a control command or the like by component mounter 10. As a result, feeder 20 supplies components so as to be able to be collected by the holding member of mounting head 13*b* at the take-out portion provided at the upper portion of feeder 20.

Head driving device 13 moves moving platform 13*a* in the horizontal direction (X-direction and Y-direction) by a linear motion mechanism. Mounting head 13*b* is fixed to moving platform 13*a* by a clamp member so as to be exchangeable (detachable). Mounting head 13*b* is integrally moved in the X-direction and the Y-direction with moving platform 13*a* by the linear motion mechanism of head driving device 13. Mounting head 13*b* uses the holding member to pick up the component supplied by component supply device 12. As the holding member, for example, a suction nozzle that picks up the component by supplied negative pressure air, a chuck that grips the component, or the like can be used.

Mounting head 13*b* holds the holding member so as to be movable in the Z-direction and to be rotatable about Q-axis parallel to Z-axis. Mounting head 13*b* adjusts the position and the angle of the holding member in accordance with the posture of the picked-up component. Mounting head 13*b* mounts the component on the mounting position of board 90 instructed by the production program. A total time zone of a time required for a predetermined number of cycles of a pick-and-place cycle of the above components and a time required for the carrying-in and carrying-out of board 90 corresponds to a cycle time per board 90.

The holding member provided on mounting head 13b may be appropriately changed according to the type of the component in the mounting process of mounting the component on board 90. Component mounter 10 attaches the suction nozzle accommodated in the nozzle station to mounting head 13b, for example, in a case where the suction nozzle used in the mounting process to be executed is not attached to mounting head 13b. The nozzle station is installed in a predetermined position in component mounter 10 in an attachable and detachable manner.

1-3. Configuration Example of Exchange System 30 and Conveyance Device 40a

As illustrated in FIG. 1 and FIG. 2, exchange system 30 includes first rail 31 and second rail 32. First rail 31 and second rail 32 form traveling path 30R of conveyance device 40a. First rail 31 extends along the conveyance direction (X-direction) of board 90, and is provided between first slot 12a and second slot 12b in the vertical direction (Z-direction).

Second rail 32 extends along the conveyance direction (X-direction) of board 90, and is provided below second slot 12b in the vertical direction (Z-direction). First rail 31 and second rail 32 extend over substantially the entire area of the conveyance direction (X-direction) of board 90 in board production line WL0. The conveyance direction (X-direction) of board 90 corresponds to the arrangement direction of four component mounters 10.

Conveyance device 40a is provided so as to be able to travel on traveling path 30R formed by first rail 31 and second rail 32. Conveyance device 40a receives power from a power transmitting section by non-contact power supply, for example, via a power receiving section provided to face the power transmitting section provided on first rail 31. The power received by the power receiving section is used for traveling of conveyance device 40a, a predetermined operation, or the like via the power receiving circuit. Conveyance device 40a detects, for example, a position (current position) on traveling path 30R by a position detection device. The position detection device can detect the position by, for example, an optical detection method, a detection method using electromagnetic induction, or the like.

The predetermined operation includes an exchange work of exchanging device DD0 used in the production of board product 900 by board working machine WM0 such as component mounter 10 with board working machine WM0. Conveyance device 40a of the present embodiment uses feeder 20 for supplying components to be mounted on board 90 as device DD0, and performs the exchange work of feeder 20 with component mounter 10 that is board working machine WM0. In addition, conveyance device 40a can perform the exchange work of feeder 20 with storage device 50 using feeder 20 as device DD0.

Conveyance device 40a of the present embodiment conveys feeder 20 from storage device 50 to first slot 12a or second slot 12b of component mounter 10, and performs a supply work of feeder 20. In addition, conveyance device 40a performs the exchange work of feeder 20 between first slot 12a and second slot 12b of component mounter 10. In addition, conveyance device 40a conveys unnecessary feeder 20 from component mounter 10 to storage device 50, and performs a collecting work of feeder 20.

Figure 3:
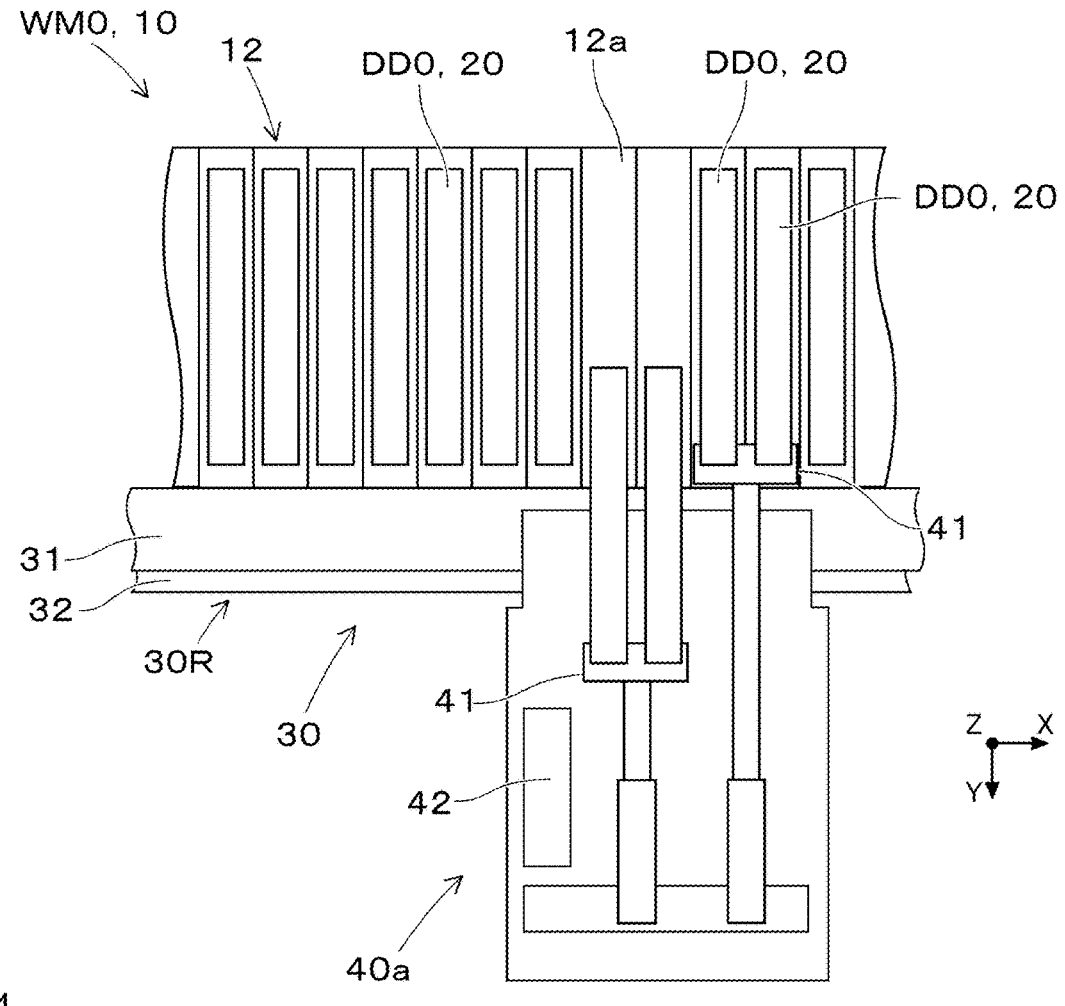
FIG. 3 is a plan view illustrating an example of an exchange work of a feeder between a conveyance device and a component supply device of a component mounter.

As illustrated in FIG. 3, conveyance device 40a includes at least one holding section 41 (two in FIG. 3) and a control device 42. In the present embodiment, each of two holding sections 41 can simultaneously clamp multiple (two in FIG. 3) feeders 20, and can simultaneously hold multiple (two) feeders 20. In addition, each of two holding sections 41 is independently movable along an attachment/detachment direction (Y-direction in the present embodiment) of feeder 20 by, for example, the linear motion mechanism or the like, and can simultaneously move multiple (two) feeders 20 along the Y-direction.

In addition, two holding sections 41 are integrally movable in the vertical direction (Z-direction) by, for example, a linear motion mechanism or the like, so that multiple (four) feeders 20 can be simultaneously moved in the Z-direction. Conveyance device 40a may include, for example, multiple (four) holding sections 41. In this case, each of multiple (four) holding sections 41 clamps one feeder 20, so that multiple (four) feeders 20 can be moved independently in the Y-direction and the Z-direction. In addition, a form of holding section 41 is not limited to the clamp mechanism and the linear motion mechanism, and can have various forms. For example, holding section 41 may include a protruding portion that can be fitted into a hole portion provided in feeder 20. In this case, feeder 20 is held by fitting the protruding portion of holding section 41 into the hole portion of feeder 20.

Control device 42 includes well-known computing device and storage device, and a control circuit is configured. Control device 42 is communicably connected to four component mounters 10, exchange system 30, storage device 50, and line management device 60. Control device 42 controls the traveling of conveyance device 40a, the operations of two holding sections 41, and the like. According to the above configuration, conveyance device 40a can move to a predetermined position along first rail 31 and second rail 32, and can perform the exchange work of feeder 20 at the stop position.

Storage device 50 can store not only feeder 20 but also device DD0 used in the production of board product 900 using board working machine WM0. For example, in a case where board working machine WM0 is component mounter 10, a reel or a tray for accommodating multiple components, a tray unit for accommodating the tray, mounting head 13b, holding member (suction nozzle, chuck or the like), a nozzle station, and board conveyance device 11 are included in device DD0.

In a case where board working machine WM0 is a solder printer that prints solder on board 90, a solder container, a mask, a squeegee, and a dispense head are included in device DD0. In a case where board working machine WM0 is an inspection machine, an inspection head is included in device DD0. The inspection machine includes a solder inspection machine that inspects solder printed on board 90, and an appearance inspector that inspects the components mounted on board 90.

In addition, conveyance device 40a can supply not only feeder 20 but also device DD0 used in the production of board product 900 to board working machine WM0. Specifically, conveyance device 40a can supply device DD0 stored in storage device 50 to board working machine WM0. In addition, conveyance device 40a can collect device DD0 that has become unnecessary in the production of board product 900 in storage device 50.

In addition, board working machine WM0 may include not only component mounter 10 but also first slot 12a and second slot 12b, and device DD0 to be held is not limited to feeder 20. That is, board working machine WM0 includes first slot 12a capable of holding device DD0 to be used in the production of board product 900, and second slot 12b capable of temporarily holding device DD0 that can preliminarily hold device DD0 that is scheduled to be used in the production of board product 900 or has become unnecessary in the production of board product 900.

1-4. Configuration Example of Device Management Apparatus 70

Device DD0 includes target device TG0 that requires update of a control program for controlling device DD0. For example, in a case where board working machine WM0 is component mounter 10, feeder 20, the tray unit, mounting head 13b, and board conveyance device 11 are included in target device TG0. In a case where board working machine WM0 is a solder printer, the dispense head is included in target device TG0. In a case where board working machine WM0 is an inspection machine, the inspection head is included in target device TG0.

The control program may be any program as long as it controls device DD0, and various programs are included therein. For example, the control program of the present embodiment is firmware incorporated in device DD0. Such a control program is updated (version up or version down) in accordance with the production of board product 900, for example, in order to improve an operation speed, stabilize the operation state, add functions of target device TG0, and the like.

It is assumed a case where target device TG0 is held in first slot 12a and the control program of target device TG0 is updated. In this case, there is a possibility that board working machine WM0 cannot use target device TG0 or at least a part of the functions of target device TG0 while the update processing of the control program is executed, so that there is a possibility that the production efficiency of board product 900 is reduced.

Figure 4:
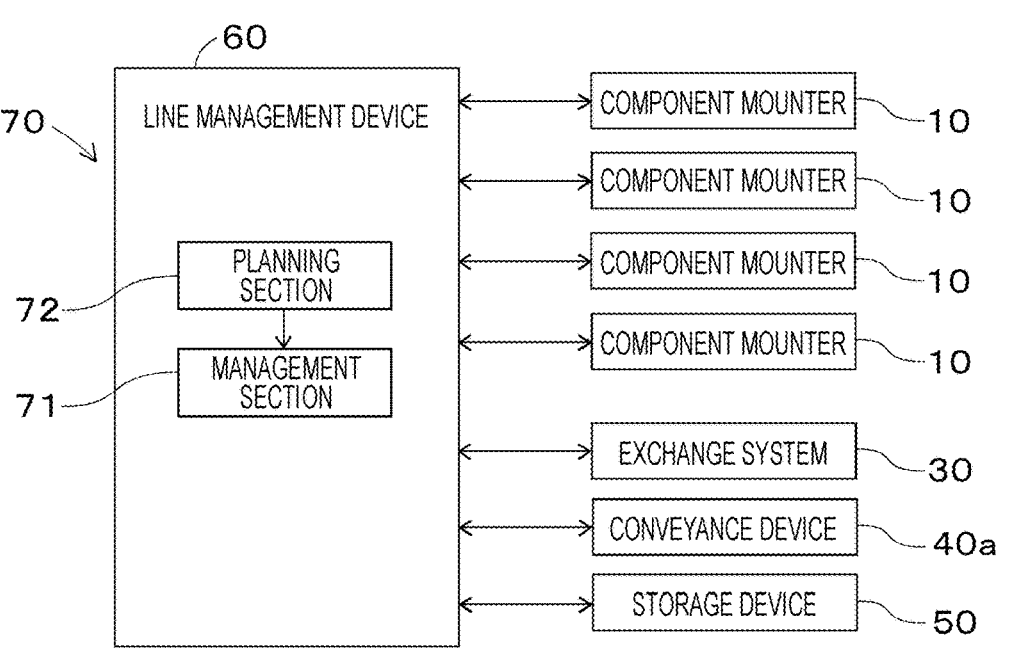
FIG. 4 is a block diagram illustrating an example of a control block of the device management apparatus.

Therefore, device management apparatus 70 is provided in board production line WL0 of the present embodiment. Device management apparatus 70 includes board working machine WM0 and management section 71. Device management apparatus 70 may also include planning section 72. Device management apparatus 70 may also include conveyance device 40a and storage device 50. As illustrated in FIG. 4, device management apparatus 70 according to the present embodiment includes component mounter 10 that is board working machine WM0, conveyance device 40a, storage device 50, management section 71, and planning section 72.

Management section 71 and planning section 72 of the present embodiment are provided in line management device 60. Management section 71 and planning section 72 can be provided on a management device, a cloud, or the like that manages multiple board production lines WL0. Management section 71 may be provided in line management device 60, and planning section 72 may be provided in the management device, the cloud, or the like that manages multiple board production lines WL0.

Figure 5:
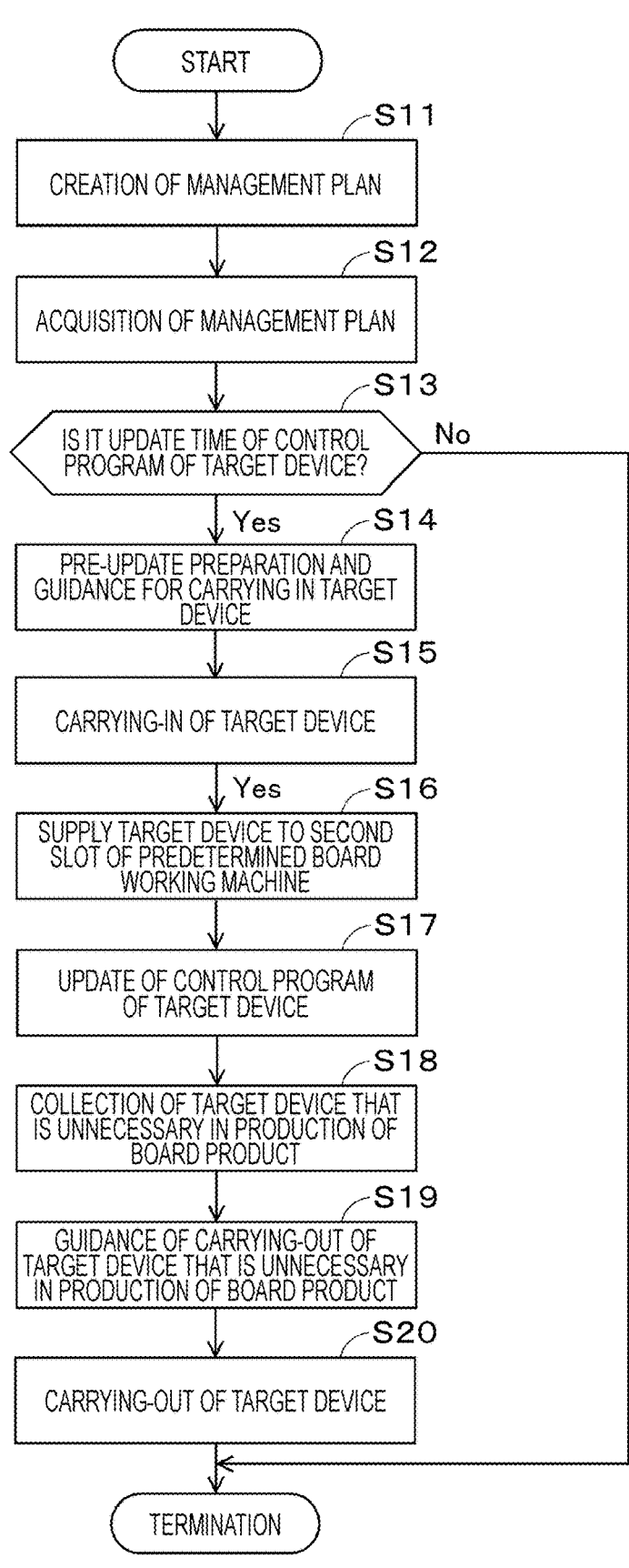
FIG. 5 is a flowchart illustrating an example of a control procedure by the device management apparatus.

In addition, device management apparatus 70 executes control, for example, according to the flowchart illustrated in FIG. 5. Management section 71 performs processing and determination illustrated in steps S12, S13, S14, S17, and S19. In addition, management section 71 causes the operator or the unmanned conveyance vehicle to perform the processing illustrated in steps S15 and S20. In addition, planning section 72 performs the processing illustrated in step S11. In addition, conveyance device 40a performs the processing illustrated in steps S16 and S18.

In second slot 12b, management section 71 updates the control program of target device TG0 requiring update of the control program for controlling device DD0. As a result, device management apparatus 70 can suppress reduction in the production efficiency of board product 900 as compared with a case where the control program of target device TG0 is updated in first slot 12a. Device management apparatus 70 has only to be able to update the control program of target device TG0 in second slot 12b, and may take various forms.

In the present embodiment, conveyance device 40a supplies target device TG0 to second slot 12b based on the management plan created by planning section 72. Then, management section 71 updates the control program of target device TG0 in second slot 12b. Thereafter, conveyance device 40a collects target device TG0 that has become unnecessary in the production of board product 900. The following description will be made in accordance with the flowchart illustrated in FIG. 5, and is an example of control performed when the control program of target device TG0 is updated.

Planning section 72 establishes a management plan for updating the control program of target device TG0 (step S11 illustrated in FIG. 5). For example, when receiving a notification that an update program is present from a management device that manages the control program of target device TG0, planning section 72 establishes a management plan. In addition, planning section 72 can formulate the management plan in response to a creation request from the operator. For example, planning section 72 sets an update time for updating the control program based on the vacant situation of second slot 12b, the time until target device TG0 is used in the production of board product 900, and the required time required for updating the control program.

The vacant situation of second slot 12b and the time until target device TG0 is used in the production of board product 900 can be acquired from the production plan of board product 900. The production plan describes the type of board product 900 that is scheduled to be produced, the planned number of products to be produced, the production time zone, board working machine WM0 to be used in the production, device DD0 to be used in the production and the required number thereof, the disposition of device DD0, and the like. The production plan is stored in a storage device of line management device 60, a storage device of the management device that manages multiple board production lines WL0, on a cloud, or the like.

The required time required for updating the control program includes, for example, a time during which the update program for updating the control program is transferred from line management device 60 to target device TG0, a time during which the update program is expanded and the control program is updated, and the like. The required time includes, as appropriate, a time required for the reboot in a case where the reboot of target device TG0 is required in the update processing of the control program, a grace time provided in consideration of the delay of the update processing due to various factors, and the like.

Planning section 72 extracts target device TG0 from devices DD0 used in production based on the production plan of board product 900. For example, planning section 72 calculates a time zone during which the idling time occurs in target device TG0 considering the time until target device TG0 is installed in vacant second slot 12b. Planning section 72 determines that the control program can be updated in second slot 12b when the idling time is longer than the required time for updating the control program. In this case, planning section 72 sets a time zone during which the idling time occurs as an update time for updating the control program. In the idling time, target device TG0 is communicably connected to board working machine WM0, and the idle state of target device TG0 is maintained.

In addition, when multiple board working machines WM0 exist as in the present embodiment, planning section 72 designates board working machine WM0 to update the control program of target device TG0. In some cases, the control program of target device TG0 can be updated in multiple board working machines WM0. In this case, for example, planning section 72 can designate board working machine WM0 to update the control program of target device TG0 so that the number of board working machines WM0 to update the control program of target device TG0 is minimized.

Management section 71 acquires the management plan created by planning section 72 (step S12 illustrated in FIG. 5). Management section 71 determines whether it is the time zone to update the control program for each target device TG0 (step S13). When there is target device TG0 for which the update time of the control program arrives (Yes in step S13), management section 71 performs pre-update preparation and guidance for carrying in target device TG0 (step S14). When there is no target device TG0 for which the update time of the control program arrives (NO in step S13), the control is temporarily terminated.

In the pre-update preparation, management section 71 notifies board working machine WM0 that updates the control program of target device TG0. When receiving the notification, board working machine WM0 prepares to update the control program of target device TG0. For example, board working machine WM0 can receive a command to update the control program of target device TG0. Management section 71 guides the operator or the unmanned conveyance vehicle to carry in target device TG0 (step S14).

As illustrated in FIG. 1, device management apparatus 70 according to the present embodiment includes storage device 50 and conveyance device 40a. Storage device 50 can store device DD0. In addition, conveyance device 40a is provided so as to be able to travel on traveling path 30R extending along the conveyance direction (X-direction) of board 90. Conveyance device 40a supplies target device TG0 to second slot 12b before the control program carried in storage device 50 is updated, and collects target device TG0 that has become unnecessary in the production of board product 900 in storage device 50.

As described above, storage device 50 of the present embodiment can store feeder 20. In addition, conveyance device 40a supplies feeder 20 to second slot 12b before the control program carried in storage device 50 is updated, and collects feeder 20 that has become unnecessary in the production of board product 900 in storage device 50. In this mode, the operator or the unmanned conveyance vehicle can carry in and out feeder 20 in storage device 50. Therefore, in second slot 12b, the convenience of the operator is improved as compared with a case where feeder 20 is directly carried in and out, so that the control of the unmanned conveyance vehicle is simplified. The above description of feeder 20 can be similarly applied to other target devices TG0. The same applies hereinafter, and although the present specification illustrates feeder 20 as target device TG0, target device TG0 is not limited to feeder 20.

As illustrated in FIG. 1, storage device 50 of the present embodiment is divided into preparation area 51 for storing target device TG0 before the carried-in control program is updated, and collection area 52 for storing target device TG0 that has become unnecessary in the production of board product 900. As a result, the carrying-in work and the carrying-out work of target device TG0 are facilitated in comparison with a case where preparation area 51 and collection area 52 are not divided.

Management section 71 guides the carrying-in of target device TG0, for example, in a display device provided in line management device 60. Management section 71 can also guide the carrying-in of target device TG0, for example, on the display screen of the portable terminal device. As a result, the operator can remove target device TG0 from storage chamber 81 in which target device TG0 is stored, and carry target device TG0 in preparation area 51 of storage device 50 (step S15).

An identification code is attached to target device TG0, and the operator reads the identification code using a reader before target device TG0 is carried in preparation area 51. As a result, management section 71 can determine whether target device TG0 to be carried in preparation area 51 is correct. When a device different from target device TG0 to be carried in is carried in preparation area 51, management section 71 guides the operator to that effect. The operator confirms target device TG0, and carries correct target device TG0 in preparation area 51.

Management section 71 can instruct the unmanned conveyance vehicle to carry in target device TG0. As a result, the unmanned conveyance vehicle causes target device TG0 to be delivered from storage chamber 81 in which target device TG0 is stored, and carries target device TG0 in preparation area 51 of storage device 50 (step S15). As in the case of the carrying-in work by the operator, management section 71 can determine whether target device TG0 to be carried in preparation area 51 is correct by the identification code.

When target device TG0 is carried in preparation area 51 of storage device 50, conveyance device 40a supplies target device TG0 to second slot 12b of predetermined board working machine WM0 (step S16). Conveyance device 40a can also collectively convey multiple target devices TG0. As a result, conveyance device 40a can reduce the number of conveyances of target device TG0. The supply destination (board working machine WM0) of target device TG0 and the supply timing period thereof are set by planning section 72.

When target device TG0 is supplied to second slot 12b, management section 71 updates the control program of target device TG0 (step S17). Specifically, management section 71 downloads the update program for updating the control program from line management device 60 to target device TG0, expands the update program, and updates the control program.

Management section 71 can update the control program every time target device TG0 is supplied to second slot 12b. However, in this case, the number of works for updating the control program increases, so that the work may be complicated. Therefore, management section 71 may update the control programs of a predetermined number of target devices TG0 simultaneously when the predetermined number of target devices TG0 are held in second slot 12b. As a result, device management apparatus 70 can suppress an increase in the number of works for updating the control program.

Target device TG0 that updates the control program simultaneously has only to be at least the same updating time as target device TG0 that updates the control program. In addition, management section 71 can also update the control programs of a predetermined number of the same type of target devices TG0 simultaneously when the predetermined number of the same type of target devices TG0 are stored in second slot 12b. The number of target devices TG0 to update the control program simultaneously (predetermined number) is set by planning section 72.

In addition, management section 71 may confirm whether a version of the control program of target device TG0 that is scheduled to be used in the production of board product 900 for which the update of the control program is completed matches a designated version of the control program designated in the production of board product 900 that is scheduled to be executed. For example, the designated version is designated for each production processing in the production plan of board product 900. The designated version is designated for each type of target device TG0. The designated version is designated by, for example, a specific version, a latest version, a version higher than the specific version, or the like.

In a case where the version of the control program of target device TG0 that is scheduled to be used in the production of board product 900 matches the designated version, target device TG0 can be used in the production of board product 900 that is scheduled to be executed. On the other hand, in a case where the version of the control program of target device TG0 that is scheduled to be used in the production of board product 900 does not match the designated version, target device TG0 cannot be used in the production of board product 900 that is scheduled to be executed. In this case, management section 71 guides the operator to the discrepancy of the version of the control program.

Management section 71 leaves target device TG0 that is scheduled to be used in the production of board product 900 among target devices TG0 for which the update of the control program has been completed in second slot 12*b*, and collects target device TG0 that has become unnecessary in the production of board product 900 (step S18). As a result, device management apparatus 70 can collect target device TG0 that has become unnecessary in the production of board product 900 from second slot 12*b* while leaving target device TG0 that is necessary in the production of board product 900 in second slot 12*b*. In the present embodiment, conveyance device 40*a* collects target device TG0, which has become unnecessary in the production of board product 900, from second slot 12*b* to collection area 52 of storage device 50. As described later, the operator or the unmanned conveyance vehicle may collect target device TG0, which has become unnecessary in the production of board product 900, from second slot 12*b*.

When target device TG0, which has become unnecessary in the production of board product 900, is collected in collection area 52 of storage device 50, management section 71 guides the carrying-out of target device TG0 for the operator or the unmanned conveyance vehicle (step S19). Management section 71 guides the carrying-out of target device TG0, for example, in the display device provided in line management device 60. Management section 71 can also guide the carrying-out of target device TG0, for example, on the display screen of the portable terminal device.

As a result, the operator carries out target device TG0 from collection area 52 of storage device 50 (step S20). Management section 71 can also instruct the unmanned conveyance vehicle to carry out target device TG0. As a result, the unmanned conveyance vehicle carries out target device TG0 from collection area 52 of storage device 50 (step S20).

Every time target device TG0 is collected in collection area 52 of storage device 50, management section 71 can guide the carrying-out of target device TG0 for the operator or the unmanned conveyance vehicle. However, in this case, the number of works for carrying out target device TG0 increases, so that the works may be complicated.

Therefore, management section 71 may instruct the operator or the unmanned conveyance vehicle to carry out target device TG0 when the number of the target devices TG0 stored in collection area 52 is equal to or greater than a predetermined number. As a result, device management apparatus 70 can suppress an increase in the number of works to carry out target device TG0. For example, management section 71 can instruct the carrying-out of target device TG0 when the number of target devices TG0 that can be carried out by the operator or the unmanned conveyance vehicle at one time is stored in collection area 52.

1-5. Modified Aspects 1-5-1. First Modified Aspect

Figure 6:
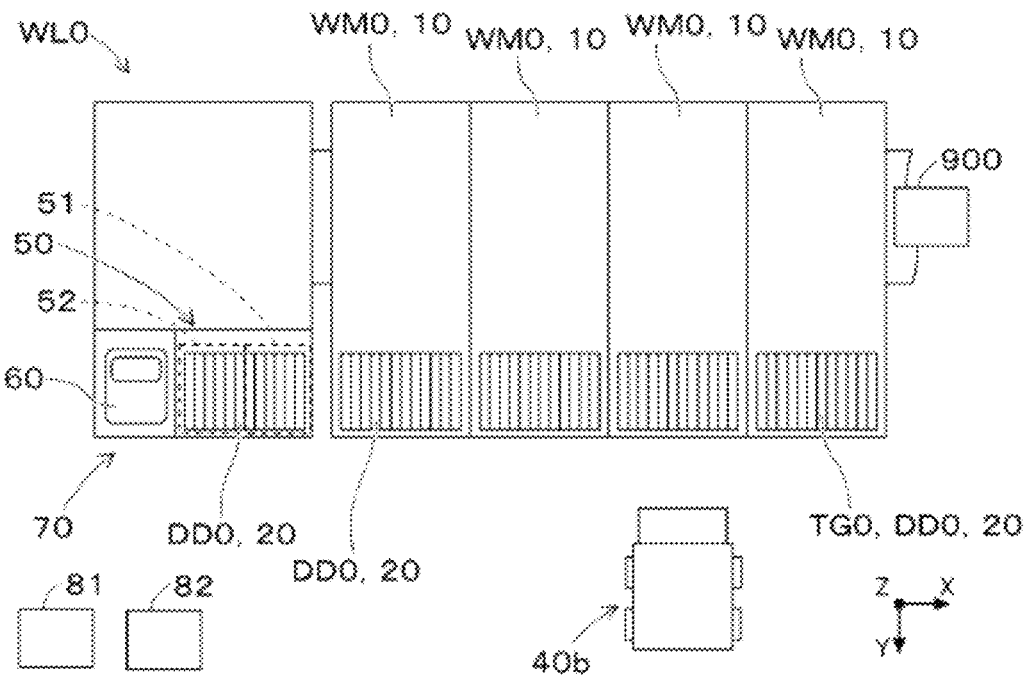
FIG. 6 is a plan view illustrating another configuration example of a board production line.

In the above embodiments, target device TG0 is supplied from storage device 50 to second slot 12*b* by conveyance device 40*a*, and is collected from second slot 12*b* to storage device 50. However, target device TG0 can be conveyed by various methods. For example, as illustrated in FIG. 6, device management apparatus 70 may include conveyance device 40*b*.

Conveyance device 40*b* is the unmanned conveyance vehicle, supplies target device TG0 before the control program is updated to second slot 12*b*, and collects target device TG0 that has become unnecessary in the production of board product 900. For example, conveyance device 40*b* causes storage chamber 81 in which target device TG0 is stored to deliver target device TG0, and supplies target device TG0 to second slot 12*b* before the control program is updated. In addition, conveyance device 40*b* collects target device TG0 that has become unnecessary in the production of board product 900 from second slot 12*b*, and stores the same in, for example, the storage chamber 81. Also in this mode, management section 71 and planning section 72 can perform the same control as the control described in the above embodiments.

1-5-2. Second Modified Aspect

In the above embodiments, management section 71 is provided in line management device 60. However, management section 71 can be provided in board working machine WM0. Specifically, board working machine WM0 includes first slot 12*a*, second slot 12*b*, and management section 71, and performs a predetermined board work on board 90 to produce board product 900. Also in this embodiment, first slot 12*a* and second slot 12*b* include the same configurations as those described above in the embodiments. In addition, management section 71 can perform the same control as the control described in the above embodiments. In addition, board working machine WM0 may include planning section 72. Planning section 72 can perform the same control as the control described in the above embodiments. In this mode, management section 71 is provided, for example, in the control device of board working machine WM0. Planning section 72 is provided, for example, in the control device of board working machine WM0, line management device 60, the management device for managing multiple board production lines WL0, on the cloud, or the like.

In addition, in this mode, it is assumed that target device TG0 before the operator or the unmanned conveyance vehicle updates the control program is supplied to second slot 12*b*, and target device TG0 that has become unnecessary in the production of board product 900 is collected from second slot 12*b*. In this case, management section 71 may guide the disposition of target device TG0 in second slot 12*b* based on the management plan for updating the control program of target device TG0. As described above, the management plan is created by planning section 72.

Management section 71 guides the disposition of target device TG0 in second slot 12*b*, for example, in the display device provided in board working machine WM0. Management section 71 can also guide the disposition of target device TG0 in second slot 12*b*, for example, on the display screen of the portable terminal device. In any case, management section 71 can display a disposition image or the like of target device TG0 in second slot 12*b*, and guide the disposition of target device TG0 in second slot 12*b*. As a result, the carrying-in work and the carrying-out work of target device TG0 by the operator are facilitated.

In addition, management section 71 can transmit the disposition of target device TG0 in second slot 12*b* to the unmanned conveyance vehicle based on the management plan for updating the control program of target device TG0. As a result, the unmanned conveyance vehicle can acquire the position (carrying-in position) of target device TG0 to be carried in second slot 12*b*, and can acquire the position (discharge position) of target device TG0 to be carried out in second slot 12*b*.

1-5-3. Other Forms

The update of the control program of target device TG0 can also be performed in storage chamber 81 in which target device TG0 is stored. For example, in a case where target device TG0 is feeder 20, the feeder rack for storing feeder 20 is included in storage chamber 81. The update of the control program of target device TG0 can also be performed in maintenance device 82 that performs the maintenance of target device TG0. For example, in a case where target device TG0 is feeder 20, a feeder inspection jig for inspecting feeder 20, a feeder automatic maintenance unit for cleaning and driving adjustment of feeder 20, and the like are included in the maintenance device 82.

In any of storage chamber 81 and maintenance device 82, the control program of target device TG0 that is not the use plan in the production of board product 900 is updated for a predetermined period. Specifically, the drive power is supplied to target device TG0, and the control program is updated in a state where it can communicate with the control device of storage chamber 81 or the maintenance device 82. The control device has a function of managing the version of the control program and a function of updating the control program of target device TG0.

The update program for updating the control program may be held by the control device, or may be held by an upper level control device (for example, line management device 60, the management device for managing multiple board production lines WL0, or the like). The control device causes target device TG0 to download the update program, expand the update program, and update the control program. The control device can confirm the version of the control program of target device TG0 for which the update of the control program is completed.

2. Device Management Method

The same applies to the device management method described above with respect to device management apparatus 70. Specifically, the device management method is a device management method using board working machine WM0, and includes a management step. The management step corresponds to the control performed by management section 71. The device management method may include a planning step. The planning step corresponds to the control performed by planning section 72. In addition, board production line WL0 including board working machine WM0 may include conveyance device 40*a* and storage device 50. Board production line WL0 may also include a conveyance device 40*b*.

3. Example of Advantageous Effects of Embodiment

According to device management apparatus 70, management section 71 is provided. Management section 71 updates the control program of target device TG0 in second slot 12*b*. Therefore, device management apparatus 70 can suppress reduction in the production efficiency of board product 900 as compared with a case where the control program of target device TG0 is updated in first slot 12*a*. The above description can be similarly applied to board working machine WM0 and the device management method.

REFERENCE SIGNS LIST

12*a*: first slot, 12*b*: second slot, 30R: traveling path, 40*a*, 40*b*: conveyance device, 50: storage device, 51: preparation area, 52: collection area, 70: device management apparatus, 71: management section, 72: planning section, 90: board, 900: board product, DD0: device, TG0: target device, WM0: board working machine

The invention claimed is:

1. A device management apparatus comprising:
   a board working machine configured to perform board work on a board to produce a board product including
      a first slot configured to hold a first feeder used in production of the board product, and
      a second slot configured to preliminarily hold a second feeder scheduled to be used in the production of the board product and configured to temporarily hold a third feeder that is not used in the production of the board product; and
   a management section configured to
      acquire a management plan that indicates that a target device requires an update of a control program, the target device being at least one of the first feeder, the second feeder, or the third feeder,
      instructs an operator or an unmanned conveyance vehicle to carry-in the target device to the second slot,
      update the control program of the target device requiring the update of the control program, the update performed in the second slot,
      when the target device is the second feeder, leave the target device in the second slot after the updating of the control program, and
      when the target device is the third feeder, carry-out the target device from the second slot after the updating of the control program.

2. The device management apparatus according to claim 1,
   wherein the management section confirms whether a version of the control program of the target device of the management plan in the production of the board product for which the update of the control program is completed matches a designated version of the control program designated in the production of the board product that is scheduled to be executed.

3. The device management apparatus according to claim 1,
   wherein the management section updates the control program of a predetermined number of the target devices simultaneously when the predetermined number of the target devices are held in the second slot.

4. The device management apparatus according claim 1, further comprising:

a planning section that establishes the management plan for updating the control program of the target device, wherein the planning section sets an update time for updating the control program based on a vacant situation of the second slot, a time until the target device is used in the production of the board product, and a required time required for updating the control program, and wherein the management section instructs the operator or the unmanned conveyance vehicle to carry-in the target device to the second slot at the update time.

5. The device management apparatus according to claim 1, further comprising:

a storage device configured to store the target device, and a conveyance device that travels on a traveling path extending along a conveyance direction of the board, configured to supply the target device in the storage device before updating the control program in the second slot, and collect the third feeder.

6. The device management apparatus according to claim 5, wherein the storage device is divided into a preparation area for storing the second feeder before updating the control program carried in, and a collection area for storing the third feeder that is not used in the production of the board product.

7. The device management apparatus according to claim 6, wherein the management section instructs the operator or the unmanned conveyance vehicle to carry out the target device when a number of multiple target devices stored in the collection area is equal to or greater than a predetermined number.

8. The device management apparatus according to claim 1, further comprising:

a conveyance device configured to supply the second feeder to the second slot before updating the control program and collect the third feeder, wherein the conveyance device is the unmanned conveyance vehicle.

9. The device management apparatus according to claim 1, wherein the control program is firmware incorporated in the device.

10. A board working machine configured to perform a predetermined board work on a board to produce a board product, comprising:

a first slot configured to hold a first feeder used in production of the board product;

a second slot configured to preliminarily hold a second feeder scheduled to be used in the production of the board product and configured to temporarily hold a third feeder that is not used in the production of the board product; and a management section configured to acquire a management plan that indicates that a target device requires an update of a control program, the target device being at least one of the first feeder, the second feeder, or the third feeder, instructs an operator or an unmanned conveyance vehicle to carry-in the target device to the second slot, update the control program of the target device requiring the update of the control program, the update performed in the second slot, when the target device is the second feeder, leave the target device in the second slot after the updating the control program, and when the target device is the third feeder, carry-out the target device from the second slot after the updating the control program.

11. The board working machine according to claim 10, wherein the management section guides a disposition of the target device in the second slot based on the management plan for updating the control program of the target device.

12. A device management method using a board working machine including a first slot configured to hold a first feeder used in production of a board product and a second slot configured to preliminarily hold a second feeder scheduled to be used in the production of the board product and configured to temporarily hold a third feeder that is not used in the production of the board product, and performing a predetermined board work on a board to produce the board product, the device management method comprising:

a management step of acquiring a management plan that indicates that a target device requires an update of a control program, the target device being at least one of the first feeder, the second feeder, or the third feeder, instructing an operator or an unmanned conveyance vehicle to carry-in the target device to the second slot, updating the control program for controlling the target device requiring the update of the control program in the second slot, when the target device is the second feeder, leaving the target device in the second slot after the updating the control program, and when the target device is the third feeder, carrying-out the target device from the second slot after the updating the control program.

13. The device management apparatus according to claim 1, the second feeder is the target device in the second slot.

* * * * *